(12) United States Patent
Klaerner et al.

(10) Patent No.: US 12,485,565 B2
(45) Date of Patent: Dec. 2, 2025

(54) METHODS OF DETERMINING AND/OR CALIBRATING A CUTTER HEIGHT ON A WEDGE BONDING MACHINE, AND RELATED WEDGE BONDING MACHINES

(71) Applicant: Kulicke and Soffa Industries, Inc., Fort Washington, PA (US)

(72) Inventors: Peter Julius Klaerner, Fort Washington, PA (US); Eric T. Scranton, Fort Washington, PA (US); Karthik Gundappa Balte, Fort Washington, PA (US); Jose De Jesus Lozano de Alva, Fort Washington, PA (US); Devesh Sharma, Fort Washington, PA (US)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 639 days.

(21) Appl. No.: 17/749,092

(22) Filed: May 19, 2022

(65) Prior Publication Data

US 2022/0371215 A1 Nov. 24, 2022

Related U.S. Application Data

(60) Provisional application No. 63/191,286, filed on May 20, 2021.

(51) Int. Cl.
*B26D 7/26* (2006.01)
*B23K 20/02* (2006.01)
(Continued)

(52) U.S. Cl.
CPC ............ *B26D 7/2628* (2013.01); *B23K 20/02* (2013.01); *B23K 20/26* (2013.01); *B23K 2101/42* (2018.08)

(58) Field of Classification Search
CPC .... B23K 2101/42; B23K 20/26; B23K 20/02; B26D 7/2628
See application file for complete search history.

(56) References Cited

U.S. PATENT DOCUMENTS 7,454,844 B1 * 11/2008 Ruby ........................ B26F 1/32
33/528
8,141,765 B2 * 3/2012 Copperthite ............ H01L 24/85
228/180.5
(Continued)

FOREIGN PATENT DOCUMENTS

CN 104282591 B * 11/2017 ............. H01L 24/78
CN 209150143 U * 7/2019 ........... H01L 23/301
(Continued)

OTHER PUBLICATIONS

International Search Report completed Sep. 13, 2022; International Patent Application No. PCT/US2022/030141.

*Primary Examiner* — Adam J Eiseman
*Assistant Examiner* — Fernando A Ayala
(74) *Attorney, Agent, or Firm* — Christopher M. Spletzer, Sr.

(57) ABSTRACT

A method of determining a cutter height on a wedge bonding machine is provided. The method includes the steps of: (a) lowering a wedge bonding tool toward a surface on the wedge bonding machine; (b) determining a first height measurement when the wedge bonding tool contacts the surface; (c) lowering a cutter of the wedge bonding machine, relative to the wedge bonding tool; (d) determining a second height measurement when the cutter contacts the surface; and (e) determining a cutter height using the first height measurement and the second height measurement.

20 Claims, 11 Drawing Sheets

(51) Int. Cl.
  *B23K 20/26*   (2006.01)
  *B23K 101/42*  (2006.01)

(56) References Cited

U.S. PATENT DOCUMENTS

| | | | | |
|---|---|---|---|---|
| 2006/0071049 A1* | 4/2006 | Farassat | ................. | H01L 24/85 |
| | | | | 228/4.5 |
| 2010/0127045 A1* | 5/2010 | Cheng | ................. | B23K 20/004 |
| | | | | 228/160 |
| 2014/0131425 A1* | 5/2014 | Liu | ........................ | H01L 24/85 |
| | | | | 228/104 |
| 2018/0348367 A1* | 12/2018 | Crear | ................... | B29C 64/307 |
| 2020/0388589 A1 | 12/2020 | Gillotti et al. | | |

FOREIGN PATENT DOCUMENTS

| | | | | | |
|---|---|---|---|---|---|
| JP | 2004122323 A | * | 4/2004 | ........... | H01L 23/301 |
| JP | 2004247693 A | | 9/2004 | | |
| JP | 2011218607 A | * | 11/2011 | ........... | H01L 23/301 |

* cited by examiner

METHODS OF DETERMINING AND/OR CALIBRATING A CUTTER HEIGHT ON A WEDGE BONDING MACHINE, AND RELATED WEDGE BONDING MACHINES

CROSS-REFERENCE TO RELATED APPLICATION

This application claims the benefit of U.S. Provisional Application No. 63/191,286, filed May 20, 2021, the content of which is incorporated herein by reference.

FIELD

The invention relates to methods of determining and/or calibrating a cutter height on a wedge bonding machine, and related wedge bonding machines.

BACKGROUND

In the semiconductor packaging industry, and other industries requiring electrical interconnection, wire and ribbon bonding are widely adopted technologies using a wire bonding machine. In connection with wire and ribbon bonding operations, various types of energy (e.g., ultrasonic energy, thermosonic energy, thermocompressive energy, etc.) are used to bond an end portion of wire/ribbon to a first bonding location. After a first bond is formed at the first bonding location, a length of wire/ribbon is extended to second bonding location, and then a second bond is formed at the second bonding location. A wire loop is a structure including at least a first bond portion and a second bond.

Exemplary conductive materials used for the wire/ribbon in conventional wire bonding (e.g., ball bonding, wedge bonding, ribbon bonding, etc.) include aluminum, copper, gold, among others.

In wedge and ribbon bonding operations, a cutter tool (a "cutter") may be used to cut a wire or ribbon after forming a wire structure (e.g., a wire loop). Such a cutter has a relative height on a wedge bonding machine (e.g., relative to a wedge bonding tool). This relative height may change, for example, by wear and/or by cutter replacement.

Thus, it would be desirable to provide improved methods for determining and/or calibrating a cutter height on a wedge bonding machine.

SUMMARY

According to an exemplary embodiment of the invention, a method of determining a cutter height on a wedge bonding machine is provided. The method includes the steps of: (a) lowering a wedge bonding tool toward a surface on the wedge bonding machine; (b) determining a first height measurement when the wedge bonding tool contacts the surface; (c) lowering a cutter of the wedge bonding machine, relative to the wedge bonding tool; (d) determining a second height measurement when the cutter contacts the surface; and (e) determining a cutter height using the first height measurement and the second height measurement.

According to another exemplary embodiment of the invention, another method of determining a cutter height on a wedge bonding machine is provided. The method includes the steps of: (a) lowering a wedge bonding tool toward a surface on the wedge bonding machine, the surface being integrated with a spring assembly; (b) determining a first height measurement when the wedge bonding tool contacts the surface; (c) compressing a spring portion of the spring assembly by lowering the wedge bonding tool further downward after contact between the wedge bonding tool and the surface; (d) raising the wedge bonding tool, and the surface, while extending the spring portion after step (c) until the cutter is in contact with the surface; (e) determining a second height measurement when the cutter contacts the surface; and (f) determining a cutter height using the first height measurement and the second height measurement.

According to another exemplary embodiment of the invention, another method of determining a cutter height on a wedge bonding machine is provided. The method includes the steps of: (a) lowering a wedge bonding tool toward a surface on the wedge bonding machine, the surface being integrated with a spring assembly; (b) compressing a spring portion of the spring assembly by lowering the wedge bonding tool further downward after contact between the wedge bonding tool and the surface; (c) lowering the cutter, with respect to the wedge bonding tool and the surface, until the cutter is in contact with the surface; and (d) determining a height measurement when the cutter contacts the surface.

According to yet another exemplary embodiment of the invention, another method of determining a cutter height on a wedge bonding machine is provided. The method includes the steps of: (a) moving at least one of a wedge bonding tool and a surface on the wedge bonding machine relative to one another; (b) determining a first height measurement when the wedge bonding tool contacts the surface; (c) moving at least one of a cutter of the wedge bonding machine and the surface relative to one another; (d) determining a second height measurement when the cutter contacts the surface; and (e) determining a cutter height using the first height measurement and the second height measurement.

According to yet another exemplary embodiment of the invention, a method of determining a cutting profile of a cutter on a wedge bonding machine is provided. The method includes the steps of: (a) determining a cutter height on the wedge bonding machine; and (b) determining a cutting profile of a cutter on the wedge bonding machine using the cutter height determined in step (a).

According to other exemplary embodiments of the invention, wedge bonding machines are provided. Such wedge bonding machines include elements referenced above in connection with the methods of determining the cutter height on the wedge bonding machine. Such wedge bonding machines may include any other element referenced in the present application including, for example, a load cell for detecting contact between the wedge bonding tool (and/or the cutter) and the surface, an electrical detection system for detecting electrical continuity between the wedge bonding tool (and/or the cutter) and the surface, a spring assembly including a surface described herein, etc.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following figures.

DETAILED DESCRIPTION

According to certain exemplary embodiments of the invention, methods of determining and/or calibrating a cutter height (e.g., a relative cutter height of the cutter with respect to a wedge bonding tool) on a wedge bonding machine are provided. By accurately knowing the cutter height (e.g., which varies when a cutter is changed on a wedge bonding machine), the wedge bonding machine may be operated (e.g., programmed) to adjust to the changed value of the cutter height.

Aspects of the invention relate to determining the cutter height when changing from a prior cutter on the wedge bonding machine to a new cutter (e.g., the cutter may be considered a consumable part). According to other aspects of the invention, the cutter height may be determined at some predetermined interval.

According to certain exemplary aspects of the invention, instead of a combined value that includes the distance the cutter has to travel to start cutting into the wire/ribbon surface and the depth the cutter cuts into the wire/ribbon (which has to be adjusted for each cutter blade exchange), exemplary methods of the invention (e.g., cutter calibration method) separate the distance into (i) the calibrated cutter height above the bond tool (which is relative to the start of cut of the wire/ribbon location) and (ii) the actual cut depth into the wire/ribbon. Such an approach allows the cut depth value to be a variable independent of the cutter. Thus, the cut depth value may be adjusted as a function of cutter ageing.

Exemplary aspects of the invention involve using active force and/or position feedback to calibrate the cutter during setup. Such an approach may apply to both wire and ribbon cutting processes. For example: (i) bond tool followed by a cutter contacting a load cell—when contact is sensed the cutter position is read out; (ii) bond tool followed by a cutter contacting a hard surface using the motion control system's motor current as feedback mechanism; and (iii) bond tool followed by a cutter contacting a hard surface using the motion control system's following error as feedback mechanism. Of course, other methods are within the scope of the invention.

Through aspects of the invention, simplified and automated cutter height measurement and/or calibration is provided after a cutter is exchanged. Further, operator influence in determining the cutter height may be eliminated.

Currently, the determinations related to cutter height are manual processes that are largely dependent upon operator intervention. The inventive methods described herein involve automating the cutter height determination.

As used herein, the term "cutter height" is a distance between a contact portion of a wedge bonding tool and a tip portion of a cutter. In certain illustrations herein, the cutter height is labelled "RCH" (relative cutter height). The cutter height may be considered a relative height between the cutter and the wedge bonding tool. Exemplary ranges for the cutter height determined in accordance with aspects of the invention are: 100-2500 microns; 300-1500 microns; and 400-1200 microns. Of course, different cutter height ranges are contemplated.

In accordance with certain aspects of the invention, a cutting profile for the cutter may be determined, where such cutting profile may utilize the cutter height determined after a cutter change on the wedge bonding machine. The cutting profile includes an amount of cutting (e.g., cutting depth) to be applied in a given application. The cutting profile may also include other elements such as time and force (e.g., cutting depth vs. time, force applied during cutting, etc.). Another value that may be used in connection with determining the cutting profile is a height of the portion of a wire extending below a bonding surface of wedge tool (e.g., see $h_{wire}$ in FIGS. 5B-5D).

Figure 1:
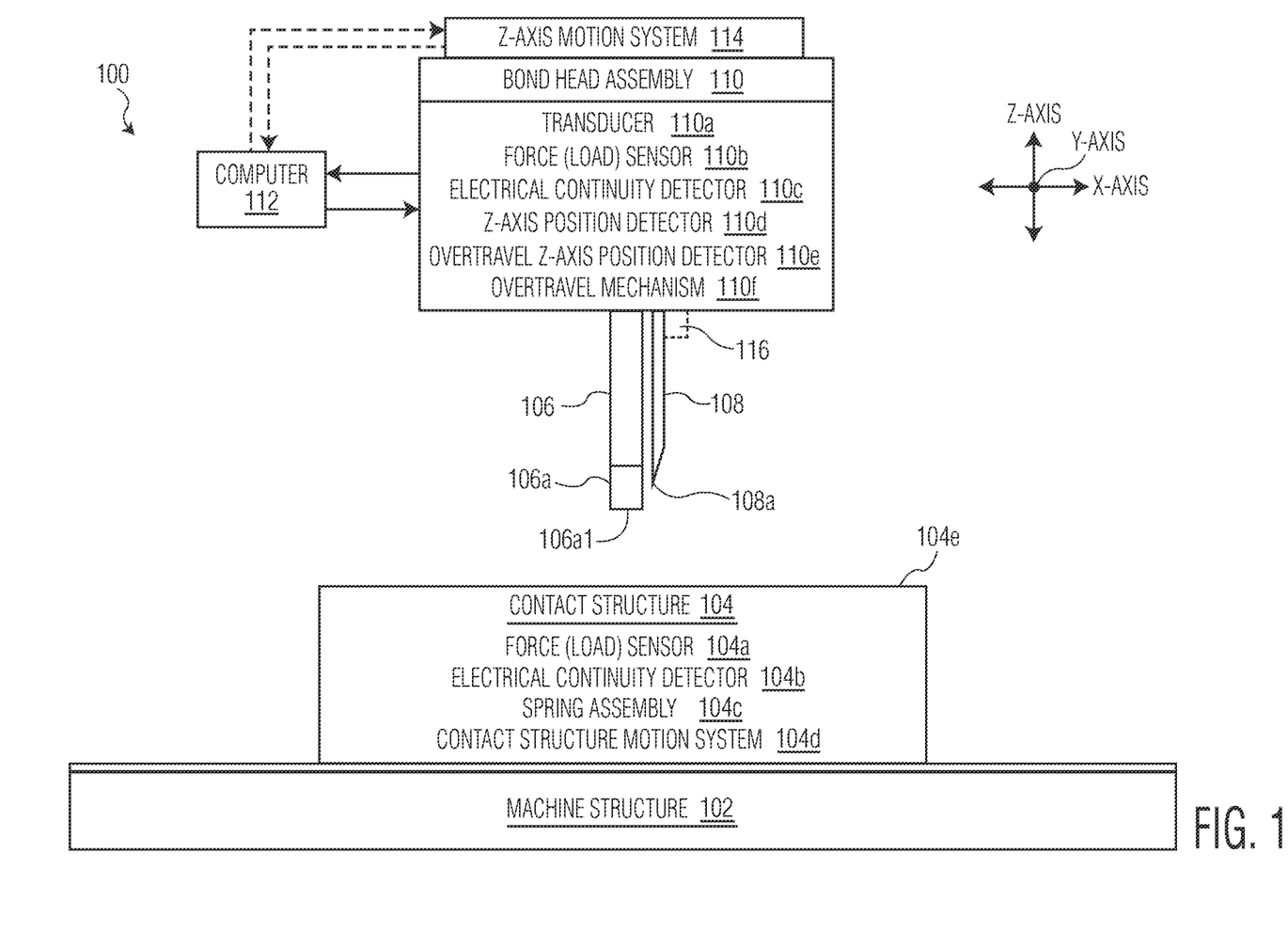
FIG. 1 is a block diagram side view of a wedge bonding machine useful for performing methods in connection with various exemplary embodiments of the invention.

FIG. 1 illustrates a wedge bonding machine 100. As will be explained herein, and as will be appreciated by those skilled in the art, certain elements shown in FIG. 1 are optional; that is, not all of the elements shown in FIG. 1 are included in each inventive wedge bonding machine within the scope of the invention. Wedge bonding machine 100 includes machine structure 102 (e.g., a workpiece support structure, or other structure) and a contact structure 104 on machine structure 102. Contact structure 104 includes surface 104e configured for use in connection with height measurements related to various aspects of the invention. Contact structure 104 may be a substrate or a workpiece configured to be wire bonded, or a different contact structure specifically configured for use in connection with the invention (e.g., a calibration or measurement station). Contact structure 104 may vary depending on the application (e.g., see contact structure 104' in FIGS. 2A-2D, contact structure 104" in FIGS. 3A-3E and in FIGS. 3F-3I, contact structure 104''' in FIGS. 4A-4D, among others).

Figures 3A, 3B:
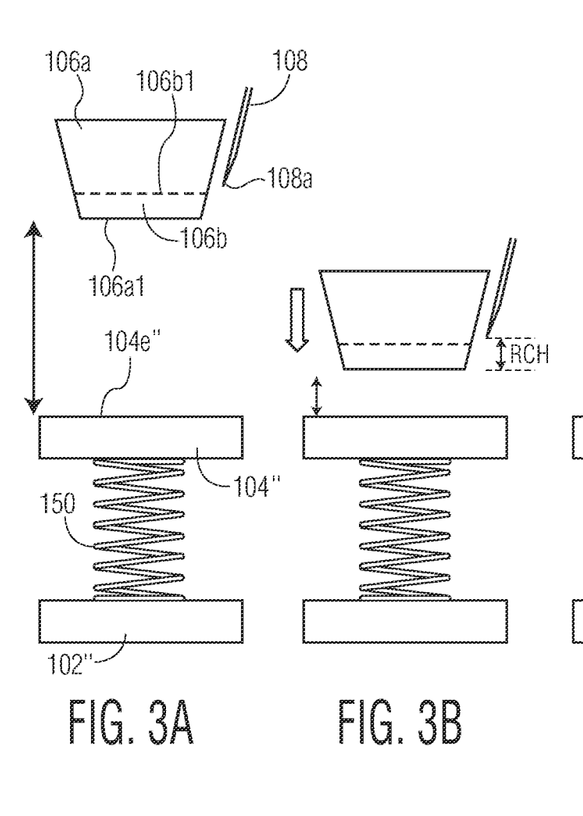
FIGS. 3A-3E are a series of block diagrams illustrating another method of determining a cutter height on a wedge bonding machine in accordance with an exemplary embodiment of the invention.
Figure 3C:
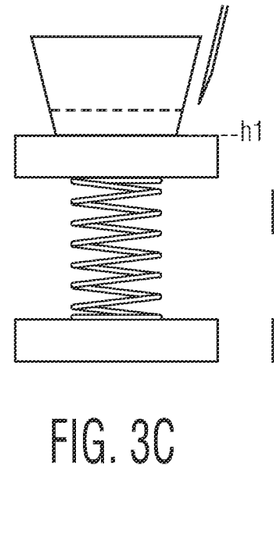
Figure 3D:
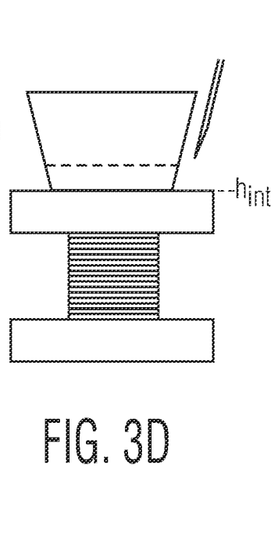
Figure 3E:
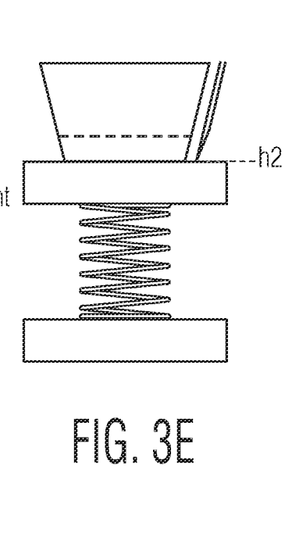
Figure 3F:
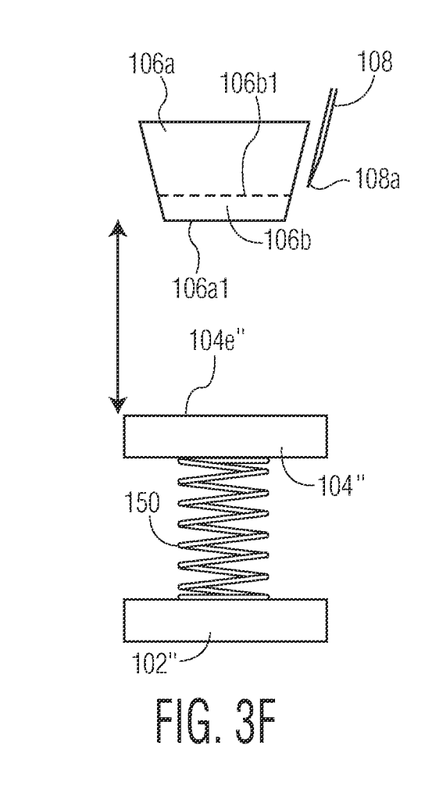
FIGS. 3F-3I are a series of block diagrams illustrating yet another method of determining a cutter height on a wedge bonding machine in accordance with an exemplary embodiment of the invention.
Figure 3G:
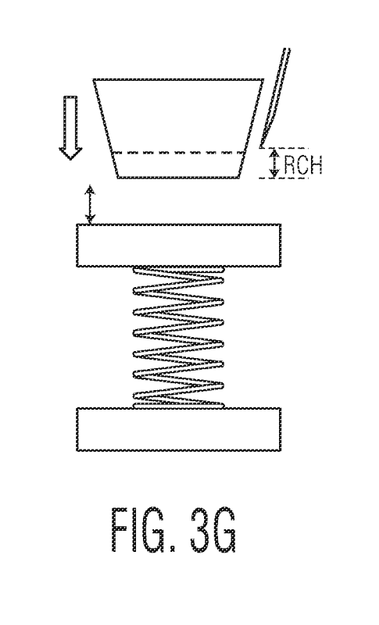
Figure 3H:
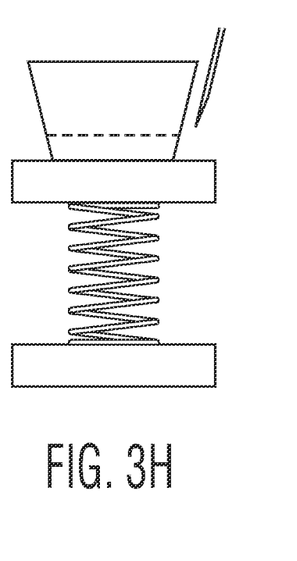
Figure 3I:
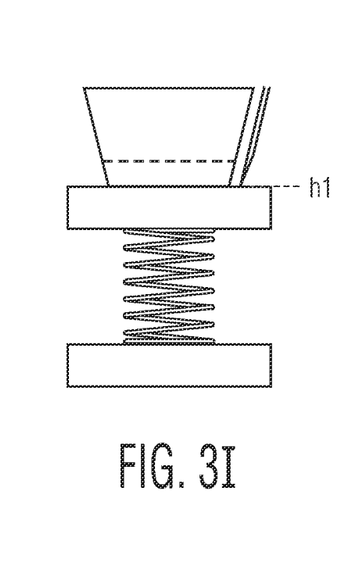
Figures 4A, 4B:
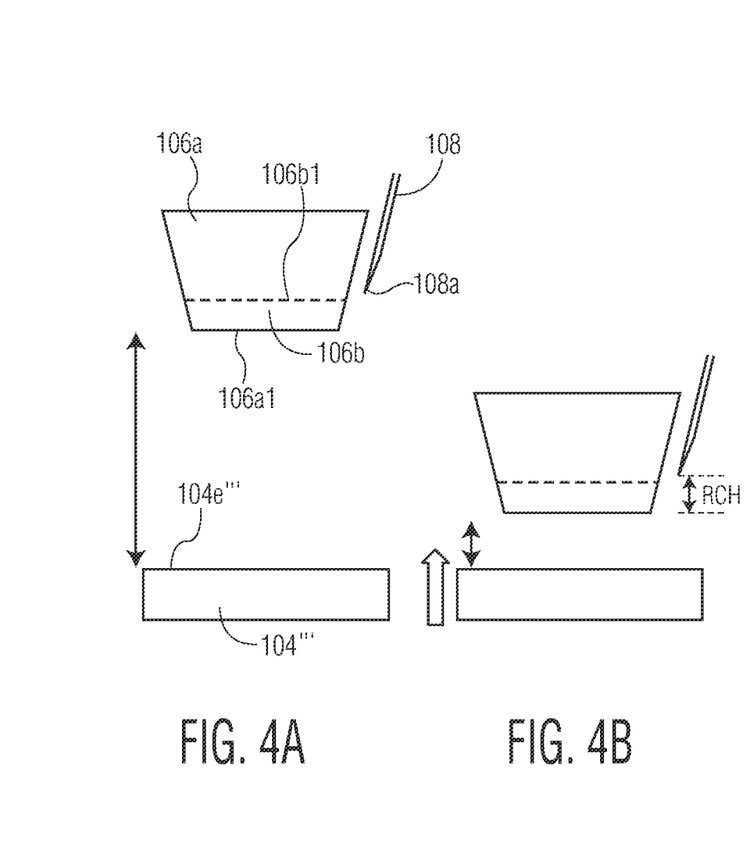
FIGS. 4A-4D are a series of block diagrams illustrating yet another method of determining a cutter height on a wedge bonding machine in accordance with an exemplary embodiment of the invention.
Figure 4C:
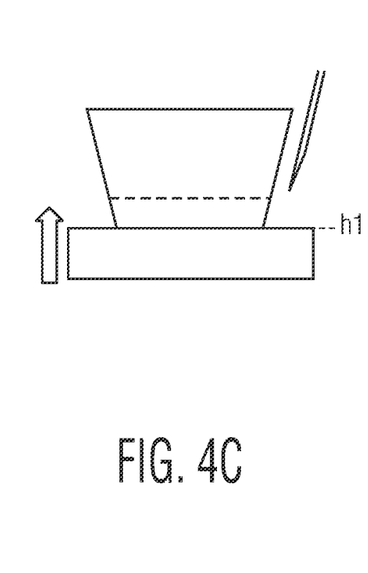
Figure 4D:
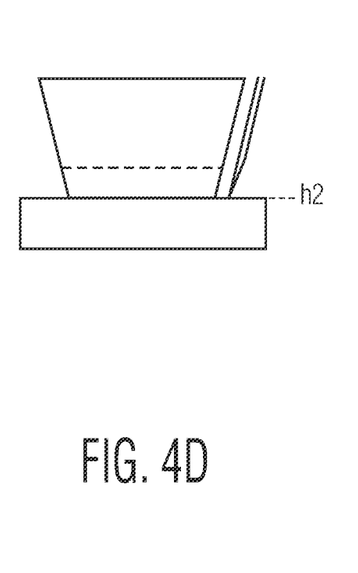

In certain embodiments of the invention, contact structure 104 may include other exemplary elements such as: force (load) sensor 104a (e.g., for determining contact between wedge bonding tool 106 and surface 104e, and/or for determining contact between cutter 108 and surface 104a); electrical continuity detector 104b (e.g., for sensing completion of an electrical circuit including wedge bonding tool 106 and surface 104e, for determining contact therebetween, and/or for sensing completion of an electrical circuit including cutter 108 and surface 104e for determining contact therebetween); spring assembly 104c (e.g., see spring portion 150 of a spring assembly shown in FIGS. 3A-3E and in FIGS. 3F-3I); and contact structure motion system 104d (e.g., for moving the contact structure along a z-axis, as in FIGS. 4B-4D).

Wedge bonding machine 100 also includes a bond head assembly 110 carrying wedge bonding tool 106 (including working end 106a having a contact surface 106a1) and cutter 108 (including cutter tip 108a). Bond head assembly 110 is moved along a z-axis of the wedge bonding machine 100 using a z-axis motion system 114. Cutter 108 may also be moved along the z-axis of the wedge bonding machine 100 using z-axis motion system 114; however, a cutter z-axis motion system 116 may optionally be included to move the cutter along the z-axis (instead of, or in addition to, using z-axis motion system 114).

Bond head assembly 110 includes transducer 110a, and may include one or more of the following: force (load) sensor 110b (e.g., for determining contact between wedge bonding tool 106 and surface 104e, and/or for determining contact between cutter 108 and surface 104e); electrical continuity detector 110c (e.g., for sensing completion of an electrical circuit including wedge bonding tool 106 and surface 104e, for determining contact therebetween, and/or for sensing completion of an electrical circuit including cutter 108 and surface 104e for determining contact therebetween); z-axis position detector 110d (e.g., a z-axis encoder for determining a height of a portion of the z-axis motion system); overtravel z-axis position detector 110e (e.g., a z-axis encoder for determining a height of a portion of an overtravel mechanism of the z-axis motion system); and an overtravel mechanism 110f.

As will be appreciated by those skilled in the art, overtravel mechanism 110f provides for independent certain movement of the cutter with respect to a wedge bonding tool. For example, as described below: overtravel mechanism 110f allows for cutter 108 to move downward independent of wedge bonding tool 106 as shown between FIG. 2C and FIG. 2D; overtravel mechanism 110f allows for wedge bonding tool 106 to move upward independent of cutter 108 as shown between FIG. 3D and FIG. 3E; overtravel mechanism 110f allows for wedge bonding tool 106 to move independent of cutter 108 as shown between FIG. 3H and FIG. 3I; and overtravel mechanism 110f allows for wedge bonding tool 106 to move upward independent of cutter 108 as shown between FIG. 4C and FIG. 4D.

Wedge bonding machine 100 also includes computer 112 (which represents one or more local or remote computing systems). Computer 112 communicates with z-axis motion system 114 and elements of bond head assembly 110 for data collection and control. For example, computer 112 receives information (e.g., from an encoder) related to z-axis height measurements used to determine a cutter height).

Figure 2A:
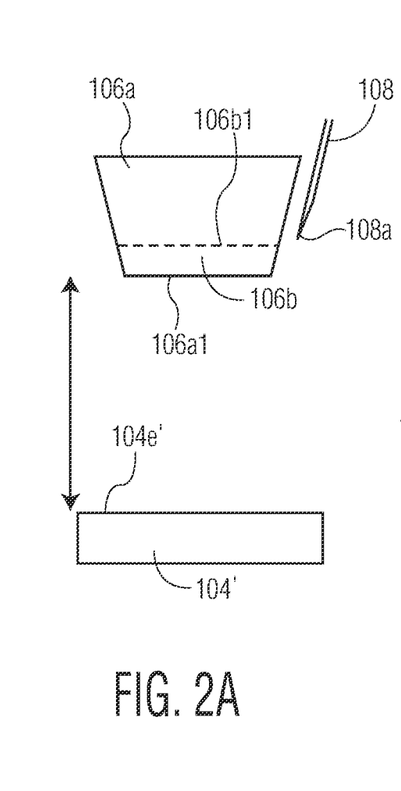
FIGS. 2A-2D are a series of block diagrams illustrating a method of determining a cutter height on a wedge bonding machine in accordance with an exemplary embodiment of the invention.
Figure 2B:
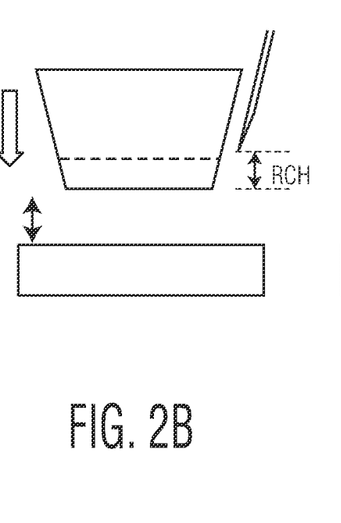
Figure 2C:
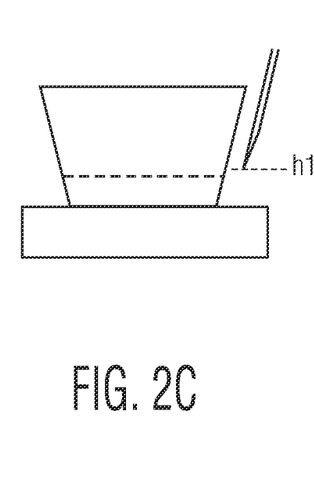
Figure 2D:
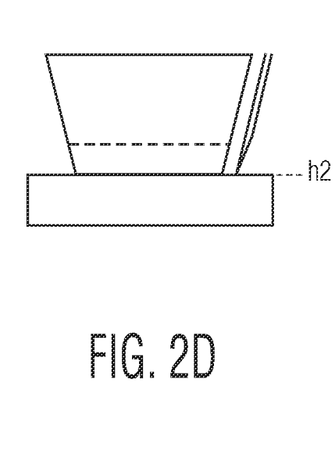

FIGS. 2A-2D are a series of block diagrams illustrating a method of determining a cutter height on wedge bonding machine 100. In FIG. 2A, wedge bonding tool 106 (only tip portion 106a is shown in FIG. 2A) and cutter 108 are positioned above surface 104e' of contact structure 104'. Although not fully visible in FIG. 2A, wedge bonding tool 106 defines a groove 106b for receiving a wire, with a peak 106b1. In FIG. 2B, wedge bonding tool 106 is being lowered toward surface 104e' (e.g., using z-axis motion system 114). In FIG. 2C, contact surface 106a1 of wedge bonding tool 106 has contacted surface 104e'. A first height measurement (h1) is determined at this time (e.g., using z-axis position detector 110d, such as an encoder of the z-axis motion system). Then, cutter 108 is lowered relative to wedge bonding tool 106 (e.g., using z-axis motion system 114 and overtravel mechanism 110f). For example, because of overtravel mechanism 110f (e.g., see FIG. 1), cutter 108 can be lowered after the contact shown in FIG. 2C. At FIG. 2D, tip portion 108a of cutter 108 contacts surface 104e'. A second height measurement (h2) is determined at this time (e.g., using z-axis position detector 110d, such as an encoder of the z-axis motion system). Using h1 and h2, a cutter height may be determined.

FIGS. 3A-3E are a series of block diagrams illustrating another method of determining a cutter height on wedge bonding machine 100. In FIG. 3A, wedge bonding tool 106 (only tip portion 106a is shown in FIG. 3A) and cutter 108 are positioned above surface 104e" of contact structure 104". Although not fully visible in FIG. 3A, wedge bonding tool 106 defines a groove 106b for receiving a wire, with a peak 106b1. In FIG. 3A, a spring assembly (including spring portion 150) is integrated with surface 104e". More specifically, spring portion 150 is provided between contact structure 104" and machine structure 102". In FIG. 3B, wedge bonding tool 106 is being lowered toward surface 104e" (e.g., using z-axis motion system 114). In FIG. 3C, contact surface 106a1 of wedge bonding tool 106 has contacted surface 104e". A first height measurement (h1) is determined at this time (e.g., using z-axis position detector 110d, such as an encoder of the z-axis motion system). At this time, wedge bonding tool 106 is further lowered to compress spring portion 150 until an intermediate height is reached (i.e., labelled as hint in FIG. 3D). At this time, wedge bonding tool 106 and surface 104e" are raised. This may be accomplished in a number of ways, depending upon the application. For example, the force applied by z-axis motion system 114 may be reduced (e.g., incrementally) such that the spring force of spring portion 150 pushes upward. In another example, the force applied by z-axis motion system 114 may be shut off such that that the spring force of spring portion 150 pushes upward. In any case, spring portion 150 extends until tip portion 108a of cutter 108 is in contact with surface 104e" as shown in FIG. 3E. A second height measurement (h2) is determined at this time (e.g., using z-axis position detector 110d, such as an encoder of the z-axis motion system). Using h1 and h2, a cutter height may be determined.

In the implementation of FIGS. 3A-3E, a first height measurement and a second height measurement are determined and used to provide the cutter height. However, as shown in FIGS. 3F-3I, in certain implementations it is possible to measure the cutter height using a single height measurement (e.g., because the measurement, such as an overtravel measurement, may begin at a known or zero reference value). Referring specifically to FIG. 3F, wedge bonding tool 106 (only tip portion 106a is shown in FIG. 3A) and cutter 108 are positioned above surface 104e" of contact structure 104". Although not fully visible in FIG. 3F, wedge bonding tool defines a groove 106b for receiving a wire, with a peak 106b1. In FIG. 3F, a spring assembly (including spring portion 150) is integrated with surface 104e". More specifically, spring portion 150 is provided between contact structure 104" and machine structure 102". In FIG. 3G, wedge bonding tool 106 is being lowered toward surface 104e" (e.g., using z-axis motion system 114). In FIG. 3H, contact surface 106a1 of wedge bonding tool 106 has contacted surface 104e". At this time, wedge bonding tool 106 is further lowered to compress spring portion 150. Then, cutter 108 is lowered, with respect to wedge bonding tool 106 and surface 104e", until tip portion 108a of cutter 108 is in contact with surface 104e" as shown in FIG. 3I. A height measurement (h1) is determined at this time (e.g., using z-axis position detector 110d, such as an encoder of the z-axis motion system or an overtravel encoder). This height measurement may be considered the cutter height, or used to derive the cutter height.

FIGS. 4A-4D are a series of block diagrams illustrating a method of determining a cutter height on wedge bonding machine 100, where wedge bonding machine includes a contact structure motion system 104d (e.g., see FIG. 1) for moving contact structure 104'''. In FIG. 4A, wedge bonding tool 106 (only tip portion 106a is shown in FIG. 4A) and cutter 108 are positioned above surface 104e''' of contact structure 104'''. Although not fully visible in FIG. 4A, wedge bonding tool 106 defines a groove 106b for receiving a wire, with a peak 106b1. In FIG. 4B, contact structure 104''' is being raised toward wedge bonding tool 106 (e.g., using contact structure motion system 104d). In FIG. 3C, contact surface 106a1 of wedge bonding tool 106 has contacted surface 104e'''. A first height measurement (h1) is determined at this time (e.g., using z-axis position detector 110d, such as an encoder of the z-axis motion system). Then, contact structure 104''' is further raised while in contact with wedge bonding tool 106 (by virtue of overtravel mechanism 110f); that is, contact structure 104''' is further raised using contact structure motion system 104d until surface 104e''' is in contact with tip portion 108a of cutter 108 (as shown in FIG. 4D). A second height measurement (h2) is determined at this time (e.g., using z-axis position detector 110d, such as an encoder of the z-axis motion system). Using h1 and h2, a cutter height may be determined.

Figure 5A:
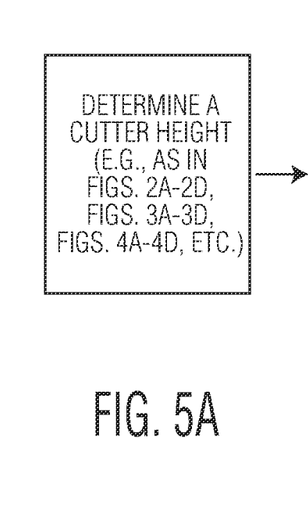
FIGS. 5A-5D are a series of block diagrams illustrating a method of determining a cutting profile of a cutter on the wedge bonding machine, in accordance with an exemplary embodiment of the invention.
Figure 5B:
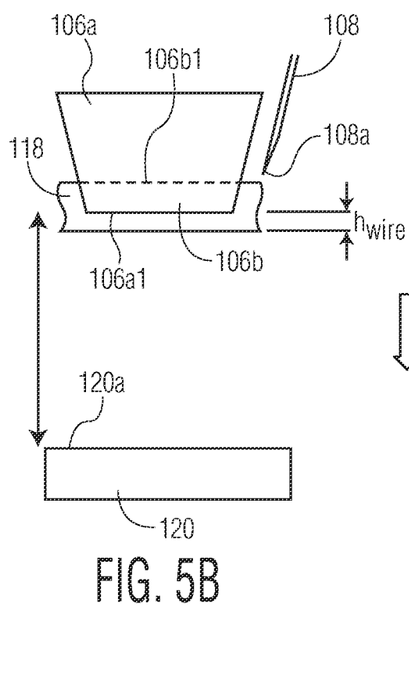
Figure 5C:
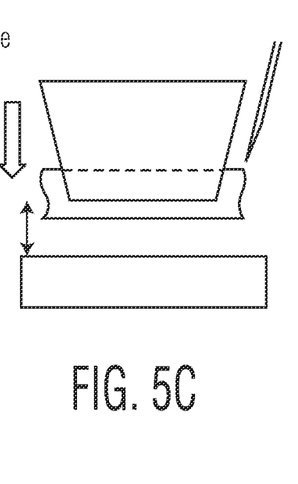
Figure 5D:
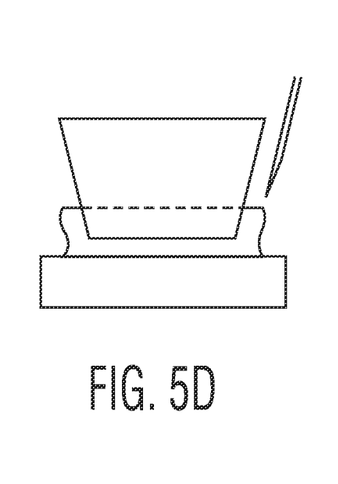

In accordance with the invention, the cutter height may be used in connection with subsequent cutting operations (e.g., in conjunction with a cutter depth value) on the wedge bonding machine. In a specific example, the cutter height may be used in connection with providing a cutting profile for a cutter on a wedge bonding machine. FIGS. 5A-5D illustrate an exemplary method of determining such a cutting profile. FIG. 5A indicates that a cutter height is determined (e.g., as in FIGS. 2A-2D, FIGS. 3A-3E, FIGS. 3F-3I, FIGS. 4A-4D, or using any other method including those within the scope of the invention). After the cutter height is determined, a wire 118 is engaged with wedge bonding tool 106. For example, in FIG. 5B wedge bonding tool 106 (only tip portion 106a is shown in FIG. 5B) and cutter 108 are positioned above surface 120a of structure 120. Although not fully visible in FIG. 5B, wedge bonding tool 106 defines a groove 106b for receiving a wire 118, with a peak 106b1. In this position, wire 118 is engaged with wire bonding tool 106. In this position, a portion of wire 118 extends below contact surface 106a1 of wedge bonding tool 106. The dimension of this portion of wire 118 is labelled as $h_{wire}$ in FIG. 5B. In FIG. 5C, wedge bonding tool 106 is being lowered toward surface 120a (e.g., using z-axis motion system 114). In FIG. 5D, wire 118 has contacted surface 120a. A height measurement is determined at this time (e.g., using z-axis position detector 110d, such as an encoder of the z-axis motion system). Using this height measurement, and the cutter height (at least including the first height measurement and the second height measurement determined in connected with the cutter height determination), a cutting profile may be determined. As will be appreciated by those skilled in the art, structure 120 (including surface 120a) shown in FIGS. 5B-5D may be any structure (and corresponding surface) on a wedge bonding machine. In fact, if desired, structure 120 may be contact structure 104, and surface 120a may be contact surface 104e (e.g., see FIG. 1).

Figure 6:
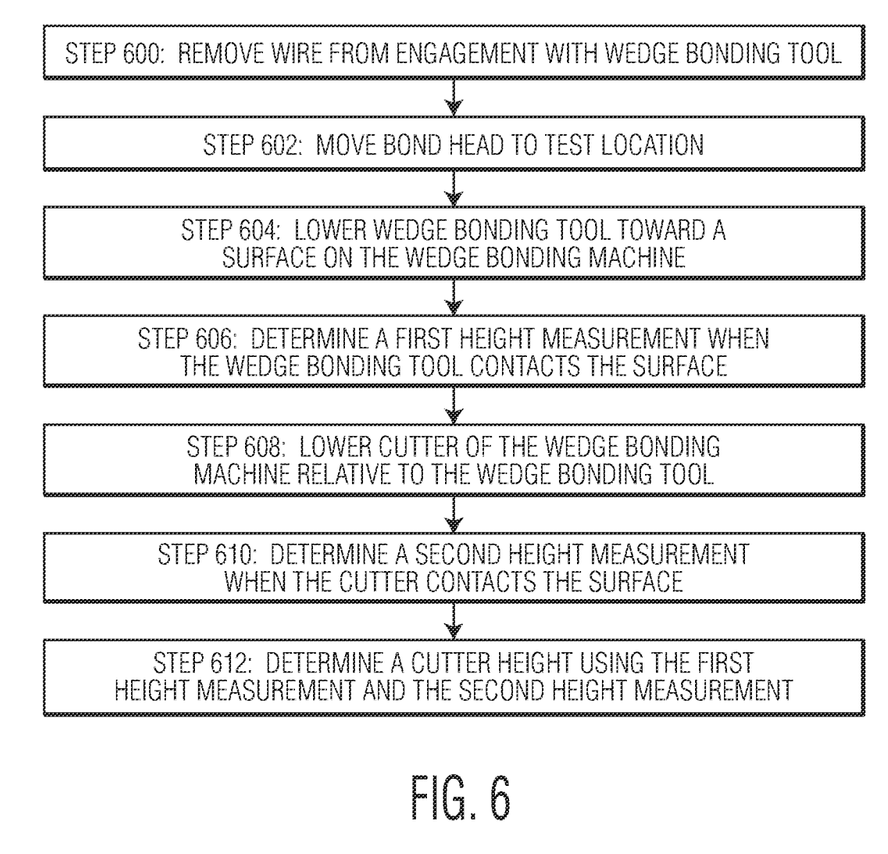
FIGS. 6, 7A-7B, and 8 are flow diagrams illustrating various methods of determining a cutter height on a wedge bonding machine in accordance with various exemplary embodiments of the invention.
Figure 7A:
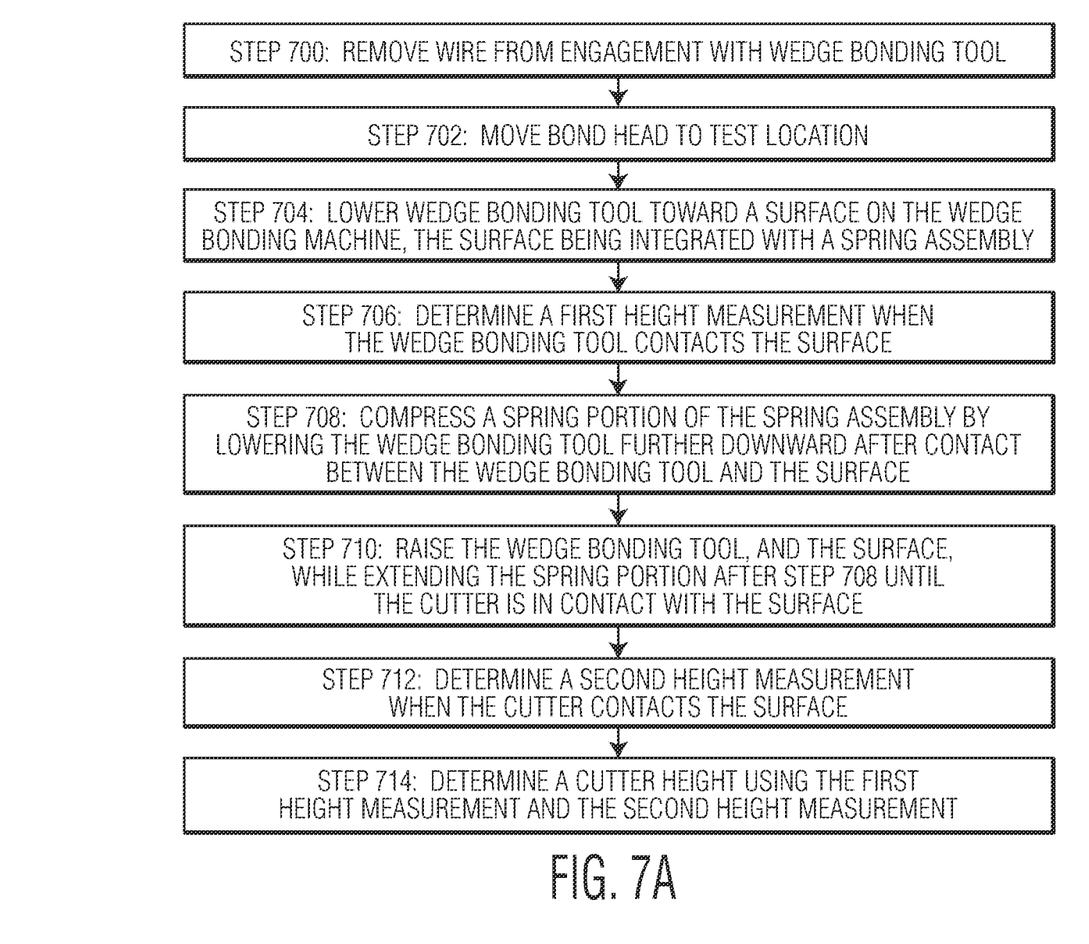
Figure 7B:
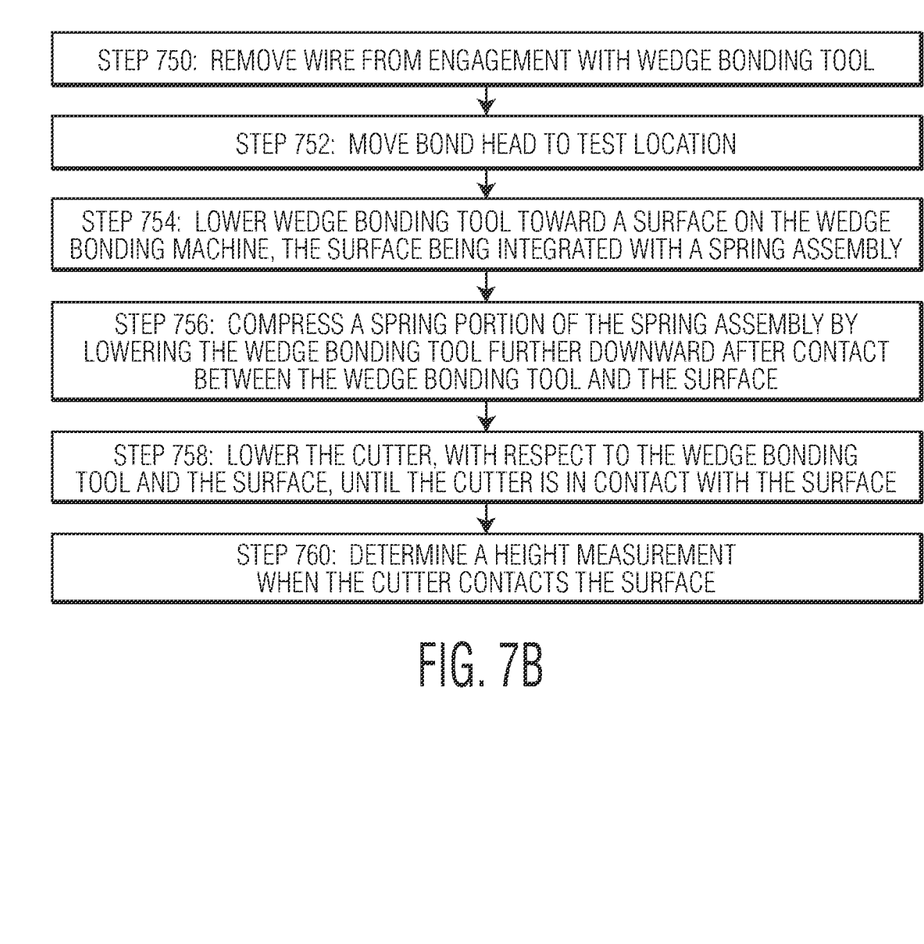
Figure 8:
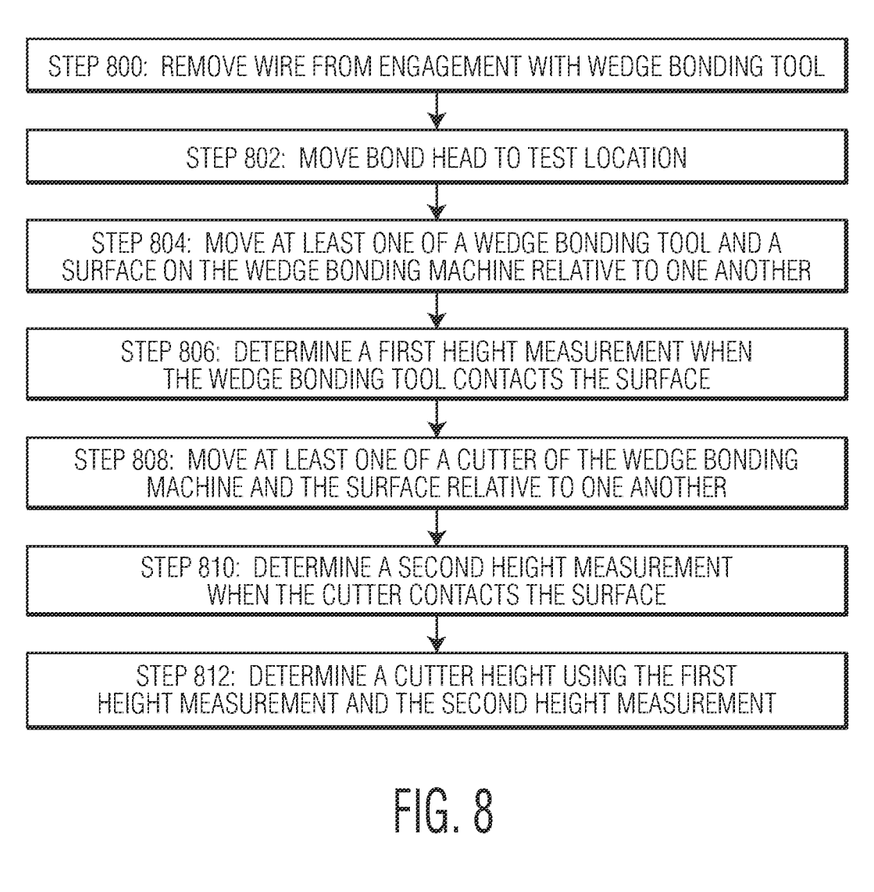
Figure 9:
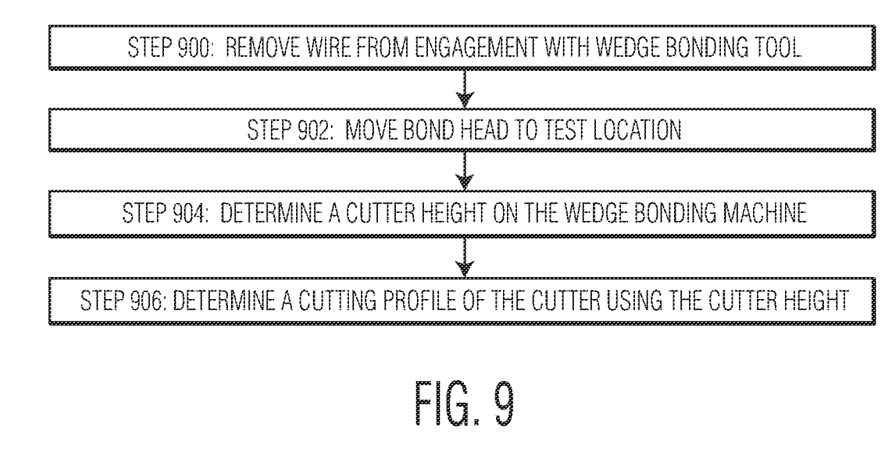
FIG. 9 is a flow diagram illustrating a method of determining a cutting profile of a cutter on the wedge bonding machine, in accordance with an exemplary embodiment of the invention.

FIGS. 6-8 are flow diagrams illustrating various exemplary methods of determining a cutter height on a wedge bonding machine in accordance with the invention. FIG. 9 is a flow diagram illustrating an exemplary method of determining a cutting profile of a cutter on a wedge bonding machine in accordance with the invention. As is understood by those skilled in the art, certain steps included in the flow diagrams may be omitted; certain additional steps may be added; and the order of the steps may be altered from the order illustrated—all within the scope of the invention.

Referring now to FIG. 6, at Step 600, a wire is removed from engagement with a wedge bonding tool. That is, if a wire is engaged with (e.g., under the working end of the wedge bonding tool) the wedge bonding tool, that wire is removed from its location. At Step 602, a bond head (e.g., carrying a wedge bonding tool and a cutter) is moved (e.g., using its xyz motion systems) to a test location. The test location may be, for example, any location as desired on the wedge bonding machine. At Step 604, a wedge bonding tool is lowered toward a surface on a wedge bonding machine (e.g., see FIG. 2B). At Step 606, a first height measurement is determined when the wedge bonding tool contacts the surface (e.g., see determination of height h1 in FIG. 2C). At Step 608, the cutter is lowered relative to the wedge bonding tool, and at Step 610, a second height measurement is determined when the cutter contacts the surface (e.g., see determination of height h2 in FIG. 2D). At Step 612, a cutter height is determined using the first height measurement and the second height measurement (e.g., by determining the difference between the first height measurement and the second height measurement).

Referring now to FIG. 7A, at Step 700, a wire is removed from engagement with a wedge bonding tool. That is, if a wire is engaged with (e.g., under the working end of the wedge bonding tool) the wedge bonding tool, that wire is removed from its location. At Step 702, a bond head (e.g., carrying a wedge bonding tool and a cutter) is moved (e.g., using its xyz motion systems) to a test location. The test location may be, for example, any location as desired on the wedge bonding machine. At Step 704, a wedge bonding tool is lowered toward a surface on a wedge bonding machine (e.g., see FIG. 3B), where the surface is integrated with a spring assembly. At Step 706, a first height measurement is determined when the wedge bonding tool contacts the surface (e.g., see determination of height h1 in FIG. 3C). At Step 708, a spring portion of the spring assembly is compressed by lowering the wedge bonding tool further after contact between the wedge bonding tool and the surface (e.g., see FIG. 3D). At Step 710, the wedge bonding tool and the surface are raised, while extending the spring portion, after Step 708, until the cutter is in contact with the surface. At Step 712, a second height measurement is determined when the cutter contacts the surface (e.g., see determination of height h2 in FIG. 3E). At Step 714, a cutter height is determined using the first height measurement and the second height measurement (e.g., by determining the difference between the first height measurement and the second height measurement).

Referring now to FIG. 7B, at Step 750, a wire is removed from engagement with a wedge bonding tool. That is, if a wire is engaged with (e.g., under the working end of the wedge bonding tool) the wedge bonding tool, that wire is removed from its location. At Step 752, a bond head (e.g., carrying a wedge bonding tool and a cutter) is moved (e.g., using its xyz motion systems) to a test location. The test location may be, for example, any location as desired on the wedge bonding machine. At Step 754, a wedge bonding tool is lowered toward a surface on a wedge bonding machine (e.g., see FIG. 3G, and contact at FIG. 3H), where the surface is integrated with a spring assembly. At Step 756, a spring portion of the spring assembly is compressed by lowering the wedge bonding tool further after contact between the wedge bonding tool and the surface (e.g., see FIG. 3I). At Step 758, the cutter is lowered, with respect to the wedge bonding tool and the surface, until the cutter is in contact with the surface (e.g., also see FIG. 3I). At Step 760, a height measurement is determined when the cutter contacts the surface (e.g., see height h1 in FIG. 3I). This height measurement is used to determine the cutter height.

Referring now to FIG. 8, at Step 800, a wire is removed from engagement with a wedge bonding tool. That is, if a wire is engaged with (e.g., under the working end of the wedge bonding tool) the wedge bonding tool, that wire is removed from its location. At Step 802, a bond head (e.g., carrying a wedge bonding tool and a cutter) is moved (e.g., using its xyz motion systems) to a test location. The test location may be, for example, any location as desired on the wedge bonding machine. At Step 804, at least one of a wedge bonding tool and a surface is moved relative to one another (see movement of wedge bonding tool 106 in FIG. 2B, or movement of surface 104e''' in FIG. 4B). At Step 806, a first height measurement is determined when the wedge bonding tool contacts the surface (e.g., see determination of height h1 in FIG. 2C, or determination of height h1 in FIG. 4C). At Step 808, at least one of a cutter and the surface is moved relative to one another (see movement of cutter 108 in FIG. 2D, or movement of surface 104e''' in FIG. 4D). At Step 810, a second height measurement is determined when the cutter contacts the surface (e.g., see determination of height h2 in FIG. 2D, or determination of height h2 in FIG. 4D). At Step 812, a cutter height is determined using the first height measurement and the second height measurement (e.g., by determining the difference between the first height measurement and the second height measurement).

Referring now to FIG. 9, at Step 900, a wire is removed from engagement with a wedge bonding tool. That is, if a wire is engaged with (e.g., under the working end of the wedge bonding tool) the wedge bonding tool, that wire is removed from its location. At Step 902, a bond head (e.g., carrying a wedge bonding tool and a cutter) is moved (e.g., using its xyz motion systems) to a test location. The test location may be, for example, any location as desired on the wedge bonding machine. At Step 904, a cutter height is determined on a wedge bonding machine. The cutter height may be determined using any technique as desired (e.g., the method of FIGS. 2A-2D, the method of FIGS. 3A-3E, the method of FIGS. 3F-3I, the method of FIGS. 4A-4D, among others). At Step 906, a cutting profile is determined using the cutter height determined in Step 904.

Additional steps may be added. For example, the portion of a wire extending below the wedge bonding tool (e.g., see FIGS. 5B-5D) may also be used on connection with the determination of the cutting profile. In such a case, after Step 904, a wire is engaged with the wedge bonding tool (e.g., positioned under the working end of the wedge bonding tool)—essentially reversing Step 900. Then, the wedge bonding tool (with the wire engaged therewith) is lowered toward a surface on the wedge bonding machine (e.g., see FIG. 5C). Then, a height measurement is determined when the wire contacts the surface (e.g., the height at FIG. 5D)—where this height measurement provides information related to $h_{wire}$ shown in FIG. 5B. With this information, the process may proceed to Step 906, where the cutting profile of the cutter is determined using the cutter height (e.g., at least the first height measurement h1, and the second height measurement h2), and the third height measurement ($h_{wire}$). More specifically, using the cutter height, and $h_{wire}$, a cutting profile may be determined.

As will be appreciated by those skilled in the art, the various height measurements may be shown with respect to a given structure, but this is simply illustrative. For example, in FIG. 2C, a height h1 is shown with respect to tip portion 108a of cutter 108. Likewise, in FIG. 2D, a height h2 is shown with respect to tip portion 108a of cutter 108. However, these height measurements (i.e., h1 and h2) may be taken with respect to various structures so long as the result is that the cutter height (e.g., RCH shown in FIG. 2B) may be determined.

As will be appreciated by those skilled in the art, the various height measurements described herein (e.g., h1, h2, $h_{wire}$, etc.) may be determined using various mechanisms. In one example, a z-axis position detector 110d may be used as shown in FIG. 1 (e.g., a z-axis encoder of a z-axis motion system). In another example, the various height measurements described herein may be determined using overtravel z-axis position detector 110e as shown in FIG. 1 (e.g., an encoder of the overtravel mechanism).

Although various embodiments of the invention are illustrated with respect to wedge bonding tools including grooves configured to receive a wire (e.g., groove 106b), it is understood that the invention is applicable to any type of wedge bonding tool (including ribbon bonding tools) with or without a groove.

Although the invention is illustrated and described herein with reference to specific embodiments, the invention is not intended to be limited to the details shown. Rather, various modifications may be made in the details within the scope and range of equivalents of the claims and without departing from the invention.

What is claimed is:

1. A method of determining a cutter height on a wedge bonding machine, the method comprising the steps of:
    (a) lowering a wedge bonding tool toward a surface on the wedge bonding machine using a z-axis motion system, the wedge bonding tool being carried by a bond head assembly, the bond head assembly being moved along a z-axis of the wedge bonding machine using the z-axis motion system;
    (b) determining a first height measurement when the wedge bonding tool contacts the surface;
    (c) lowering a cutter of the wedge bonding machine, relative to the wedge bonding tool, the cutter being carried by the bond head assembly;
    (d) determining a second height measurement when the cutter contacts the surface; and
    (e) determining the cutter height using the first height measurement and the second height measurement.

2. The method of claim 1 wherein the cutter is lowered in step (c) using the z-axis motion system.

3. The method of claim 1 wherein the cutter is lowered in step (c) using a cutter motion system that is different from the z-axis motion system.

4. The method of claim 1 wherein each of the first height measurement and the second height measurement are determined using an encoder of the z-axis motion system.

5. The method of claim 1 wherein the bond head assembly includes an overtravel mechanism such that the cutter can be lowered in step (c) after the contact of the wedge bonding tool in step (b).

6. The method of claim 5 wherein the first height measurement is determined using an encoder of the overtravel mechanism.

7. The method of claim 5 wherein the second height measurement is determined using an encoder of the overtravel mechanism.

8. The method of claim 5 wherein each of the first height measurement and the second height measurement is determined using an encoder of the overtravel mechanism.

9. The method of claim 1 wherein the cutter height is determined by determining a difference between the first height measurement and the second height measurement.

10. The method of claim 1 wherein the cutter height is used in subsequent cutting operations on the wedge bonding machine.

11. The method of claim 1 wherein the cutter height is used in subsequent cutting operations, in conjunction with a cutter depth value, on the wedge bonding machine.

12. The method of claim 1 wherein the method is performed in connection with changing from a prior cutter to the cutter on the wedge bonding machine.

13. The method of claim 1 wherein the method is performed at a predetermined interval.

14. The method of claim 1 wherein step (b) includes using at least one of a load cell, an electrical continuity connection, and a z-axis motion system characteristic to determine when the wedge bonding tool contacts the surface.

15. The method of claim 1 wherein step (d) includes using at least one of a load cell, an electrical continuity connection, and a z-axis motion system characteristic to determine when the cutter contacts the surface.

16. A method of determining a cutter height on a wedge bonding machine, the method comprising the steps of:

(a) lowering a wedge bonding tool toward a surface on the wedge bonding machine using a z-axis motion system;
(b) determining a first height measurement when the wedge bonding tool contacts the surface using a z-axis position detector of the wedge bonding machine;
(c) lowering a cutter of the wedge bonding machine, relative to the wedge bonding tool using the z-axis motion system after step (b);
(d) determining a second height measurement when the cutter contacts the surface using the z-axis position detector or another z-axis position detector of the wedge bonding machine; and
(e) determining the cutter height using the first height measurement and the second height measurement.

17. The method of claim 16 wherein the wedge bonding tool and the cutter are carried by a bond head assembly of the wedge bonding machine.

18. The method of claim 17 wherein the bond head assembly includes an overtravel mechanism such that the cutter can be lowered in step (c) after the contact of the wedge bonding tool in step (b).

19. The method of claim 16 wherein the cutter height is determined by determining a difference between the first height measurement and the second height measurement.

20. The method of claim 16 wherein the cutter height is used in subsequent cutting operations on the wedge bonding machine.

\* \* \* \* \*